(12) United States Patent
Kim

(10) Patent No.: US 7,268,393 B2
(45) Date of Patent: Sep. 11, 2007

(54) SEMICONDUCTOR DEVICES AND METHODS OF MANUFACTURING THE SAME

(75) Inventor: Jea-Hee Kim, Kyungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 314 days.

(21) Appl. No.: 11/112,533

(22) Filed: Apr. 22, 2005

(65) Prior Publication Data

US 2005/0247975 A1 Nov. 10, 2005

(30) Foreign Application Priority Data

Apr. 23, 2004 (KR) .................. 10-2004-0028157

(51) Int. Cl.
*H01L 29/72* (2006.01)

(52) U.S. Cl. .................. 257/336; 257/344; 257/389; 257/406; 257/408; 257/336; 257/E21.626; 257/E21.64

(58) Field of Classification Search ............... 257/336, 257/344, 389, 406, 408, E21.626, E21.64
See application file for complete search history.

(56) References Cited

U.S. PATENT DOCUMENTS 5,734,185 A * 3/1998 Iguchi et al. ............... 257/336
6,642,581 B2 * 11/2003 Matsuda et al. ............ 257/369
6,924,529 B2 * 8/2005 Kim et al. .................. 257/334
7,071,067 B1 * 7/2006 Ahmad ....................... 438/302
2003/0216021 A1 * 11/2003 Kim et al. .................. 438/595

* cited by examiner

*Primary Examiner*—Matthew Smith
*Assistant Examiner*—Thanh V. Pham
(74) *Attorney, Agent, or Firm*—Andrew D. Fortney

(57) ABSTRACT

Semiconductor devices and methods of manufacturing semiconductor devices which achieve higher integration and higher operating speed are provided. A disclosed example semiconductor device includes a semiconductor substrate of a first conductivity type; a gate insulating layer on the substrate; and a gate on the gate insulating layer. The substrate also includes first spacers on opposite side walls of the gate. Each of the first spacers has a notch at a lower end adjacent the substrate. The example device also includes second spacers on side walls of respective ones of the first spacers; source/drain junction regions of a second conductivity type in the substrate on opposite sides of the gate and the second spacers; and LDD regions of the second conductivity type in the substrate at opposite sides of the gate and the first spacers. Each of the LDD regions has an end adjacent a respective one of the junction regions. The disclosed example device also includes pocket regions of the first conductivity type in the substrate at opposite sides of the gate. Each of the pocket regions has an end adjacent a respective one of the LDD regions, and each of the pocket regions has more depth under the gate than in other regions.

4 Claims, 3 Drawing Sheets

SEMICONDUCTOR DEVICES AND METHODS OF MANUFACTURING THE SAME

FIELD OF THE DISCLOSURE

The present disclosure relates generally to semiconductor fabrication and, more particularly, to semiconductor devices and methods of manufacturing semiconductor devices including a short channel transistor.

BACKGROUND

In general, realizing a good characteristic of cell transistors is very important in manufacturing a memory device such as a DRAM (dynamic random access memory).

However, as semiconductor devices have become increasingly highly integrated, the line width of the design rule has become further decreased and, thus, the gate line width of a transistor has also decreased. Accordingly, short channel effects such as a punch-through phenomenon and a severe fluctuation in threshold voltage (Vth) have arisen, which make it more difficult to achieve sufficient quality in the characteristics of a transistor.

Conventionally, a pocket ion implantation scheme is utilized in manufacturing a transistor in order to reduce the short channel effects. In the pocket ion implantation scheme, a lightly doped drain (LDD) region is formed to an end of a source and/or drain, and the substrate concentration only around the LDD region is higher than at the channel.

Such a conventional manufacturing method for a transistor will hereinafter be described in detail with reference to FIG. 1A to FIG. 1C.

As shown in FIG. 1a, a gate insulating layer 11 and a gate 12 are sequentially formed on a P-type semiconductor substrate 10. A relatively thin screen oxide 13 is formed on the gate 12 and on a surface of a substrate 10.

The screen oxide 13 acts as a protective layer to prevent damage of the substrate 10 in a later process of ion implantation.

Subsequently, P-type pocket regions 14a and 14b are formed in the substrate 10 on opposite sides of the gate, by implanting P-type impurity ions 14 in a direction which is slanted with respect to the surface of the substrate 10 (i.e., in a direction which is not perpendicular to the surface of the substrate).

Then, as shown in FIG. 1B, low concentration N-type impurity ions 15 are implanted in a direction vertical to the substrate 10, such that N-type LDD regions 15a and 15b are formed on the substrate 10 on opposite sides of the gate 12.

Subsequently as shown in FIG. 1C, the screen oxide 13 is removed, and a spacer 100 is formed on the substrate 10 and the gate 12. In more detail, the spacer 10 is formed on side walls of the gate 12 by sequentially depositing a first oxide layer 16, a nitride layer 17, and a second oxide layer 18 and then etching them back such that an uppermost portion of the gate 12 may become exposed.

The first and the second oxide layers 16 and 18 may be formed as a tetraethyl orthosilicate (TEOS) layers. The nitride layer 17 may be formed as a silicon nitride (SiN) layer. The first oxide layer 16 acts as a buffer layer for alleviating stress on the nitride layer 17.

Subsequently, high concentration N-type impurity ions 19 are implanted in a direction vertical to the substrate 10, such that N-type source/drain junction regions 19a and 19b are formed in the substrate 10 on opposite sides of the spacers 100.

Since the integration of semiconductor devices has been highly accelerated, the gate length has become very short, (e.g., as short as about 70 nm under the 90 nm rule), and, therefore, the profile of the pocket regions 14a and 14b under the gate 12 are becoming more important.

For effectively limiting short channel effects such as punch-through and severe fluctuation of the threshold voltage, the pocket regions 14a and 14b should be configured to have more depth under the gate 12 than in other regions, (e.g., by increasing the impurity concentration in the pocket regions 14a and 14b).

However, when the impurity concentration of the pocket region 14a and 14b is increased, the junction capacitance also increases, thereby deteriorating the operation speed of the resulting semiconductor device. Accordingly, it is difficult to realize a high speed device.

DETAILED DESCRIPTION

First, an example transistor constructed in accordance with the teachings of the present invention will now be described with reference to FIG. 2E.

Figure 1A:
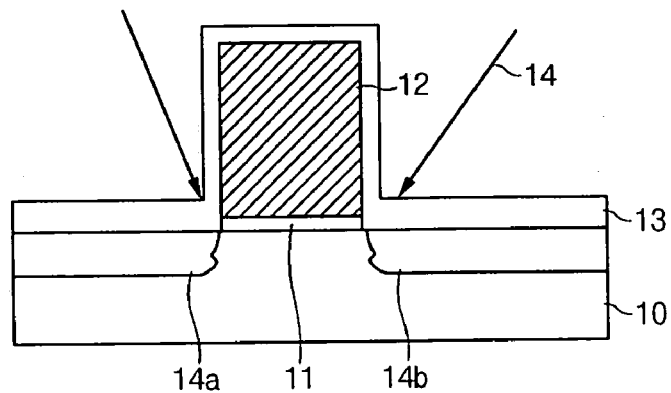
FIG. 1A to FIG. 1C illustrate sequential stages of a conventional method for manufacturing a semiconductor device.
Figure 1B:
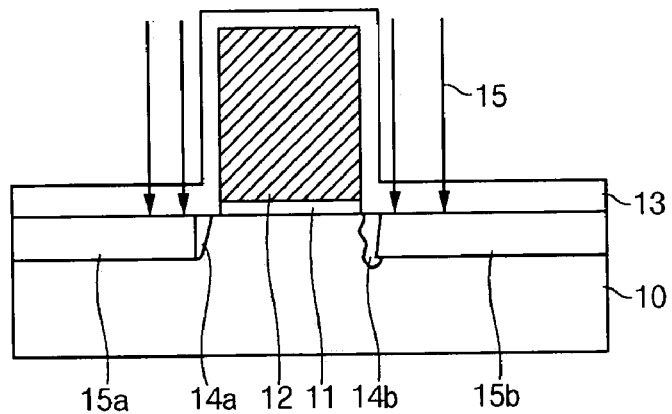
Figure 1C:
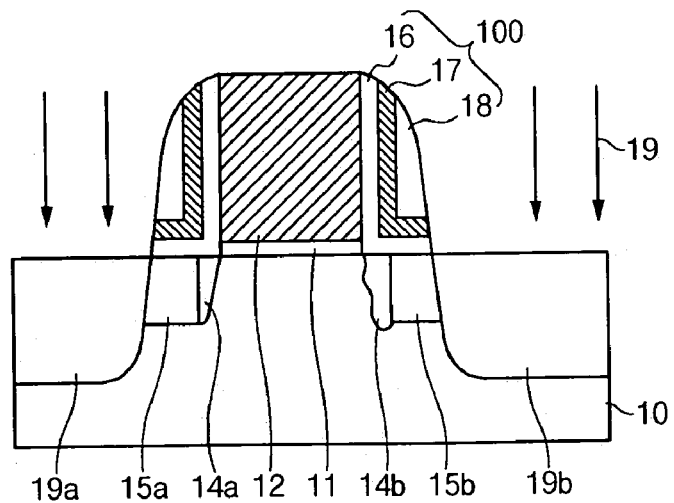
Figure 2A:
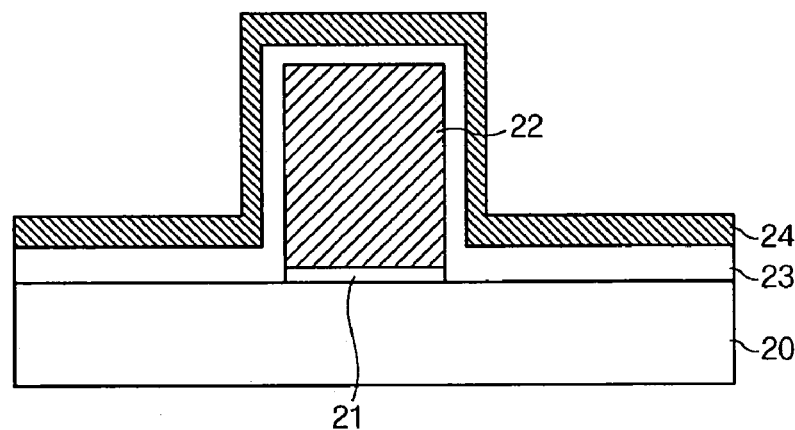
FIG. 2A to FIG. 2E illustrate sequential stages of an example method for manufacturing a semiconductor device performed in accordance with the teachings of the present invention.
Figure 2B:
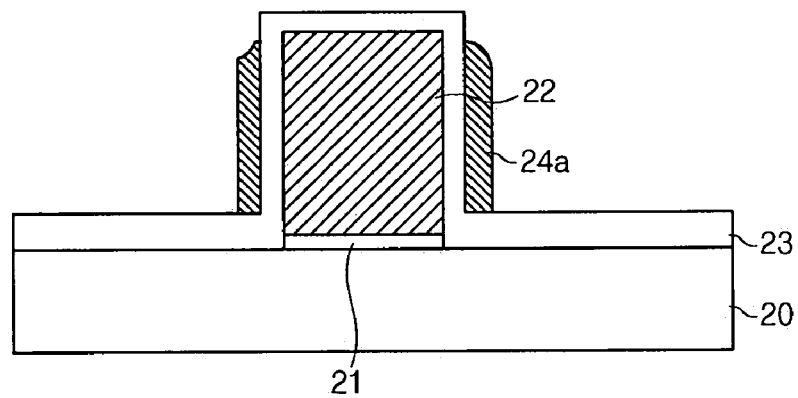
Figure 2C:
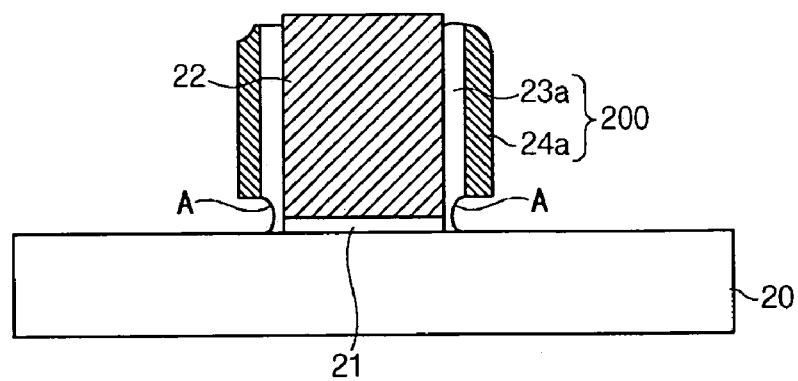
Figure 2D:
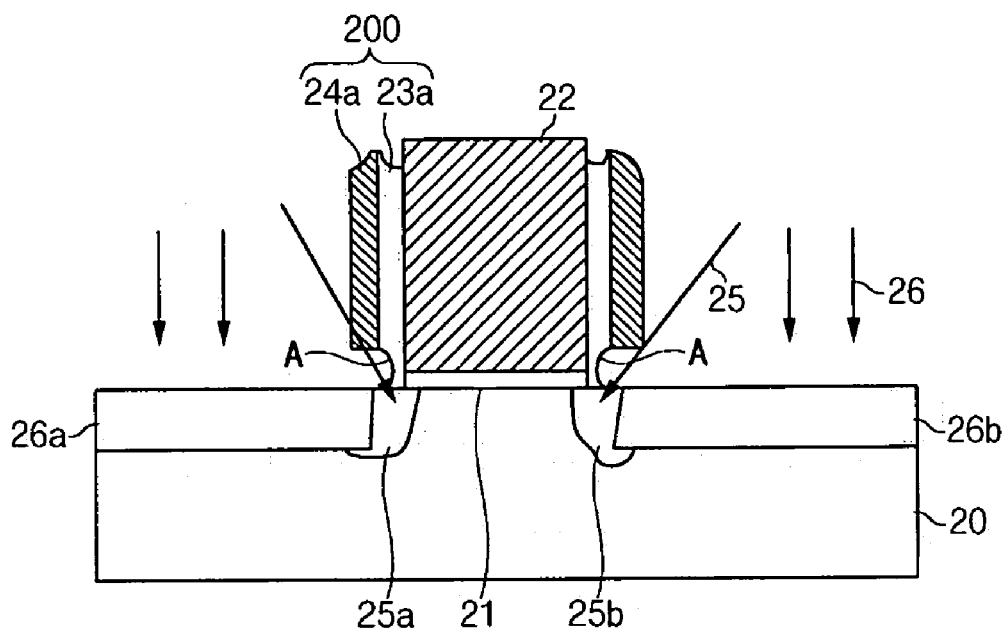
Figure 2E:
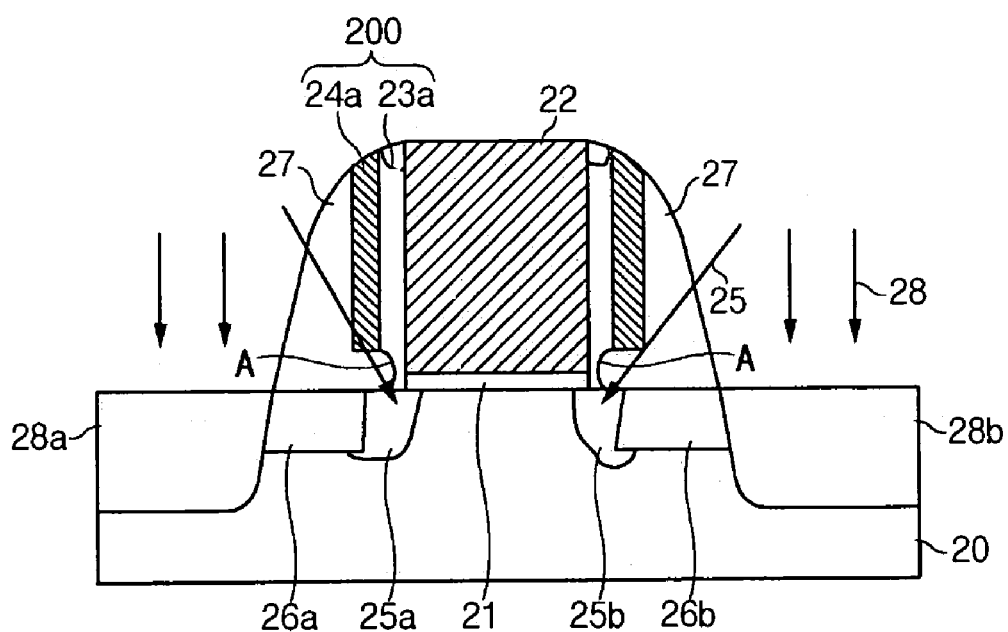

As shown in the example of FIG. 2E, a gate insulating layer 21 and a gate 22 are sequentially formed above a P-type semiconductor substrate 20.

A first spacer 200 having a notch A at its bottom is formed on each side wall of the gate 22. A second spacer 27 is formed on the side wall of the first spacer 200.

In the illustrated example, the first spacer 200 is formed in a dual pattern configuration including an interior spacer pattern 23a and an exterior spacer pattern 24a. In the example of FIG. 2E, the notch A is formed to have a size below about 10 nm. The interior spacer pattern 23a of the illustrated example is formed as an oxide layer (e.g., $SiO_2$), and the exterior spacer pattern 24a of the illustrated example is formed as a nitride layer (e.g., SiN).

In addition, the illustrated second spacer 27 is formed as an oxide layer (e.g., TEOS).

N-type source/drain junction regions 28a and 28b are formed on a surface of the substrate 20 on opposite sides of the second spacer 27. N-type LDD regions 26a and 26b are formed on the surface of the substrate 20 on opposite sides of the first spacer 200, in conjunction with the ends of the junction regions 28a and 28b.

On the surface of the substrate 20 on opposite sides of the gate 22, P-type pocket regions 25a and 25b are formed in conjunction with the ends of the LDD regions 26a and 26b. The P-type pocket regions 25a and 25b are formed to have more depth under the gate 22 than in other regions.

An example method for manufacturing the above-described transistor will now be described in detail with reference to FIG. 2A to FIG. 2E.

As shown in FIG. 2A, the gate insulating layer 21 and the gate 22 are sequentially formed on the P-type semiconductor substrate 20.

Subsequently, an oxide layer 23 (e.g., SiO$_2$) and a nitride layer 24 (e.g., SiN) are sequentially deposited above the gate 22 and the substrate 20 to form a first spacer.

In the illustrated example, the oxide layer 23 has a thickness of about 5 to 10 nm, and the nitride layer 24 has a thickness of about 3 to 7 nm.

Then, as shown in FIG. 2B, the nitride layer 24 is etched back by dry etching so as to expose the oxide layer 23 above the gate 22, and accordingly, the exterior spacer pattern 24a is formed on the oxide layer 23 adjacent to the gate 22.

Subsequently as shown in FIG. 2C, the interior spacer pattern 23a is formed on the side wall of the gate 22 by wet-etching the oxide layer 23 using buffered hydrogen fluoride (BHF). Consequently, the first spacer 200 is formed in a dual pattern configuration including the interior and exterior spacer patterns 23a and 24a.

During the wet-etching, the nitride layer pattern 24a acts as an etch barrier. Accordingly the notch A is naturally formed under the first spacer 200.

Preferably, the wet-etching is performed to an extent such that the notch A is formed in a size less than or equal to about 10 nm.

Subsequently, as shown in FIG. 2D, using the first spacer 200 as a mask, P-type impurity ions 25 are implanted in a direction slanted with respect to the substrate 20, such that the P-type pocket regions 25a and 25b are formed on the surface of the substrate at both sides of the gate 22.

In this example, the P-type impurity ions 25 are implanted into the substrate 20 deeper under the gate 22 by the notch A. Therefore, the pocket regions 25a and 25b have more depth under the gate 22 than in other regions.

Then, low concentration N-type impurity ions 26 are implanted into the substrate 20 in a substantially vertical direction (i.e., substantially perpendicular to the surface of the substrate). Therefore, the N-type LDD regions 26a and 26b are formed on the surface of the substrate 20 on both sides of the first spacer 200, having their ends in conjunction with the pocket regions 25a and 25b.

Then, as shown in FIG. 2E, an oxide layer is deposited on a front surface of the substrate 20 to form a second spacer. The oxide layer of the illustrated example is a tetraethyl orthosilicate (TEOS) layer and is deposited in a thickness of about 60 to 80 nm.

Subsequently, the second spacer 27 is formed on the side walls of the first spacers 200 by etching back the oxide layer such that the uppermost portion of the gate 22 is exposed.

Finally, high concentration N-type impurity ions 28 are implanted into the substrate 20 in a substantially vertical direction (i.e., substantially perpendicular to the surface of the substrate). Therefore, the N-type source/drain junction regions 28a and 28b are formed on the surface of the substrate 20 at both sides of the second spacer 27, having their ends in conjunction with the LDD regions 26a and 26b.

The above described example referred to the case of a P-type substrate. However, persons of ordinary skill in the art will readily appreciate that application of the teachings of the present invention may be readily made to the case of an N-type substrate with reference to the above description.

In the above described example, a notch A is formed under a side wall of a gate 22 while forming a spacer 200, and a pocket region 251, 25b is formed relatively deep under the gate 22.

Therefore, even if the gate length is shortened (e.g., to less than 70 nm), the short channel effects such as a punch-through phenomenon and a severe fluctuation of the threshold voltage may be reduced. Accordingly, a more highly integrated semiconductor device may be fabricated.

In addition, since impurity ion concentration does not need to be increased to form the pocket regions 25a, 25b, an increase of the junction capacitance and the associated deterioration of the operation speed caused by such capacitance may be effectively prevented. Thus, a higher speed device may be easily realized.

From the foregoing, persons of ordinary skill in the art will readily appreciate that semiconductor devices and methods of manufacturing semiconductor devices have been disclosed which achieve higher integration and higher speed in a short channel transistor by preventing a short channel effect without causing an increase of junction capacitance.

An example semiconductor device disclosed herein includes a semiconductor substrate 20, first and second spacers 200, 27, a source/drain junction region 28a, 28b, an LDD region 26a, 26b, and a pocket region 25a, 25b.

In the illustrate example, the semiconductor substrate has a first conductivity type. A gate insulating layer 21 and a gate 22 are sequentially formed on the substrate 20. The first spacer 200 is formed on a side wall of the gate 22 and has a notch A formed at it lower end adjacent the substrate 20. In the illustrated example, the second spacer 27 is formed on a side wall of the first spacer 200. The source/drain junction regions 28a, 28b are of a second conductivity type and are formed on a surface of the substrate 20 at opposite sides of the second spacer 27. The LDD regions 26a, 26b are of the second conductivity type and are formed on a surface of the substrate 2- at both sides of the first spacer 200, in conjunction with ends of the junction regions 28a, 28b. The pocket regions 25a, 25b are of the first conductivity type and are formed on the surface of the substrate 20 at opposite sides of the gate 22 in conjunction with the ends of the LDD regions 26a, 26b. The pocket regions 25a, 25b have more depth under the gate 22 than in other regions.

An example manufacturing method described herein may be performed as follows.

A gate insulating layer 21 and a gate 22 are sequentially formed on a semiconductor substrate 20 of a first conductivity type. A first spacer 200 that having a notch A there below is formed on a side wall of the gate 22. Pocket regions 25a, 25b of a first conductivity type are formed on a surface of the substrate at both sides of the gate 22 by ion implantation performed in a slanted direction using the first spacer 200 as a mask. Accordingly, the pocket regions 25a, 25b are formed with more depth under the gate 22 than in other regions. LDD regions 26a, 26b of a second conductivity type are formed on the surface of the substrate 20 at both sides of the first spacer 200. Each of the LDD regions has an end adjacent a respective one of the pocket regions 25a, 25b. A second spacer 27 is formed on a side wall of the first spacer 200. Heavily doped source/drain junction regions 28a, 28b of the second conductivity type are formed on the surface of the substrate 20 at both sides of the second spacer 27. Each of the junction regions 28a, 28b has an end adjacent a respective one of the LDD regions.

It is noted that this patent claims priority from Korean Patent Application Serial Number 10-2004-0028157 which was filed on Apr. 23, 2004, and which is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A semiconductor device comprising:
a semiconductor substrate of a first conductivity type;
a gate insulating layer on the substrate;
a gate on the gate insulating layer;
first dual spacer patterns directly on opposite side walls of the gate, the first dual spacer patterns having a notch at a lower end adjacent the substrate, wherein the notch has a size less than the thickness of the first dual spacer patterns;
second spacers on outer side walls of respective ones of the first dual spacer patterns;
source/drain junction regions of a second conductivity type in the substrate on opposite sides of the gate and the second spacers;
LDD regions of the second conductivity type in the substrate at opposite sides of the gate and the first dual spacer patterns, each of the LDD regions having an end adjacent a respective one of the junction regions; and
pocket regions of the first conductivity type in the substrate at opposite sides of the gate, each of the pocket regions having an end adjacent a respective one of the LDD regions, and each of the pocket regions having more depth under the gate than in other regions.

2. A semiconductor device as defined in claim 1, wherein at least one of the first dual spacer patterns comprises:
an interior spacer pattern formed on the side wall of the gate; and
an exterior spacer pattern formed on a side wall of the interior spacer pattern.

3. A semiconductor device as defined in claim 2, wherein:
the interior spacer pattern is an oxide layer; and
the exterior spacer pattern is a nitride layer.

4. A semiconductor device as defined in claim 1, wherein the notch has a size of about 10 nm.

* * * * *